(12) United States Patent
Kurkovskiy

(10) Patent No.: US 6,215,365 B1
(45) Date of Patent: Apr. 10, 2001

(54) INDUCTIVE PROXIMITY SENSOR OSCILLATOR

(75) Inventor: Igor Kurkovskiy, Twinsburg, OH (US)

(73) Assignee: Pepperl + Fuchs, Twinsburg, OH (US)

( * ) Notice: Subject to any disclaimer, the term of this patent is extended or adjusted under 35 U.S.C. 154(b) by 0 days.

(21) Appl. No.: 09/325,979

(22) Filed: Jun. 4, 1999

(51) Int. Cl.$^7$ .............. G01R 33/00; G01R 27/26
(52) U.S. Cl. .......... 331/65; 331/167; 331/117 R; 331/74; 331/109; 324/655; 324/236
(58) Field of Search .................. 331/65, 74, 109, 331/167, 117 R; 307/116; 324/654, 655, 236

(56) References Cited

U.S. PATENT DOCUMENTS

| | | | |
|---|---|---|---|
| 3,746,897 | 7/1973 | Karatjas | 331/116 X |
| 3,853,455 | 12/1974 | Riordan et al. | |
| 3,978,519 | 8/1976 | Stalley et al. | 331/20 X |
| 4,124,354 | 11/1978 | Gann | |
| 4,309,672 | 1/1982 | Havens | 331/96 |
| 4,347,740 * | 9/1982 | Townsend | 331/65 X |
| 4,378,513 | 3/1983 | Yoshikawa et al. | 315/176 |
| 4,492,935 | 1/1985 | Fleischer et al. | 331/135 |
| 4,560,953 | 12/1985 | Bozio | 331/108 D |
| 4,617,534 | 10/1986 | Lill | 331/117 R |
| 4,833,427 | 5/1989 | Leuthold et al. | 331/165 |
| 4,871,984 | 10/1989 | Laton et al. | 331/76 X |
| 4,879,512 | 11/1989 | Leonard et al. | 331/65 |
| 5,072,166 | 12/1991 | Ehsani | |
| 5,331,296 | 7/1994 | Davis | 331/158 |

* cited by examiner

*Primary Examiner*—Arnold Kinkead
(74) *Attorney, Agent, or Firm*—Fay, Sharpe, Fagan, Minnich & McKee, LLP

(57) ABSTRACT

An inductive proximity sensor oscillator having a differential comparator in combination with a negative feedback network and a positive feedback network connected to the comparator. The positive feedback network determines the frequency and amplitude of the generated oscillations. An LC resonant tank circuit is connected between a non-inverting input and a fixed reference voltage, and a current limiting resistor connected between the non-inverting input and the output of the comparator. The negative feedback network provides a simple, fast and reliable start-up mechanism. It comprises a capacitor connected between the inverting input of the comparator and the circuit ground and a resistor connected between the non-inverting input and output of the comparator.

14 Claims, 4 Drawing Sheets

INDUCTIVE PROXIMITY SENSOR OSCILLATOR

BACKGROUND OF THE INVENTION

The present invention relates to an oscillator circuit, and more particularly to an oscillator circuit including an LC resonant tank, a differential comparator, and a start-up circuit.

FIG. 1 illustrates a simple LC resonant circuit comprising a capacitor $C_1$ and an inductor $L_1$. When this circuit is provided with power, such as by power supply PS, the capacitor $C_1$ is charged.

Once capacitor $C_1$ is charged and the power supply is removed, capacitor $C_1$ acts to discharge into inductor $L_1$, and the energy stored in capacitor $C_1$ is converted to the magnetic field associated with inductor $L_1$. When capacitor $C_1$ is discharged current flow will come to an end. However, with nothing to sustain it, the magnetic field of inductor $L_1$ will begin to collapse converting its energy back into electricity and recharging capacitor $C_1$. During this time period, current flows around the circuit opposite its previous direction. With capacitor $C_1$ again charged, the circuit is back to its original state, except that a small amount of energy will have been lost, due to inductive heat loss or other imperfections in the circuit. The cycle of charging/discharging repeats continuously until all the energy has been lost. The loss of energy is represented by the decaying output signal waveform of FIG. 2.

It is to be noted the circuit generates a frequency of oscillation which is constant, and that each combination of inductor $L_1$ and capacitor $C_1$ has its own resonant frequency, and altering the values of the elements alters the rate of oscillation.

In order to maintain the output signal from dying out, an amplifier AMP is added with a feed-back network FB, to produce feed-back voltage, such as shown in FIG. 3. If the phase shift through amplifier AMP and feed-back circuit FB is correct, the feedback signal at point X will be exactly in-phase with the signal driving the error terminals of amplifier A, so that the phase shift around the entire loop is 0°.

The loop gain of the amplifier circuit is an important consideration in configuration of an oscillator circuit. If the loop gain is less than unity, the output signal will die out because there will not be enough voltage being returned. On the other hand, if the loop gain is greater than unity, the loop gain voltage is greater than input voltage and the output voltage builds up such as shown by the waveform of FIG. 4. Finally, when loop gain equals unity, there will be no change in the output voltage and a steady state output will exist, such as depicted by the waveform of FIG. 5.

In a practical oscillator, the value of loop gain is greater than unity when the circuit is first energized. A small starting voltage is applied to the terminals of an amplifier, and the output voltage builds up. After the output voltage reaches a desired level, the value of the output gain automatically decreases to unity and the output amplitude remains constant.

The starting voltage of an oscillator is built into resistors of the oscillator circuit. Every resistor generates noise voltages, these voltages are produced by the random motion of electrons in the resistor. Thus, each resistor acts as a small voltage source producing essentially all frequencies.

With regard to an oscillator circuit such as shown in FIG. 3, when power is first applied to the system, the only signals in the system are noise voltages, which have very small amplitudes. The noise signals are amplified and appear at the output terminals. The amplified noise is used to drive the feedback circuit, usually a resonant circuit. The feedback voltage FBv will be maximum at the resonant frequency of the feedback circuit FB. In other words, the amplified noise is filtered so that only one sinusoidal component returns with exactly the right phase for positive feedback.

There are two common ways for loop gain to decrease to unity. First, the increasing signal will eventually force the output stage to clip any additional increases in output. When this happens, the value of gain decreases. The harder the clipping, the lower the voltage gain. In this way, the gain decreases to whatever value is needed to make loop gain equal to unity.

Another manner of limiting gain is to include an element into the feedback circuit to reduce the gain of the feedback circuit. Often, this element is a non-linear resistor that reduces gain when the output signal has reached the desired value. In this way, the oscillator automatically makes loop gain equal to unity after the oscillations have built up.

A widely used type of oscillator is known as a linear oscillator. A linear oscillator has a proportional output response to an input voltage. A drawback with linear oscillators is that the start-up time from when the noise is first applied in the system, to the time when a sufficient oscillation has been built up to reach a steady state, is unpredictable. This unpredictability exists since there are dependencies upon the size of the initial noise level and the amount of gain within the amplifier. For example, if the noise initially produced in the oscillator is very small, it will take a longer time than if the initial noise is larger. Also, the different gains of a linear amplifier will also cause unpredictability in the time it takes to reach a steady state.

A less well known oscillator is a non-linear oscillator. In a non-linear oscillator, the amplifier is configured as a comparator circuit. A distinction between linear and non-linear oscillators is that, unlike a linear oscillator, the non-linear oscillator requires some sort of start-up mechanism, i.e. it does not have an automatic self-starting capability. Examples of non-linear oscillators are described in U.S. Pat. Nos. 4,833,427 to Leuthold et al., 4,879,512 to Leonard et al., 4,617,534 to Lill, and 4,560,953 to Bozio. Each of these are class of oscillator which includes a comparator, resonant tank and start-up mechanism. The cited patents are generally directed to different schemes for applying noise to the oscillator system.

The U.S. Pat. No. 4,560,953 describes a start-up circuit which includes a starting capacitor $C_2$ wherein noise is induced on one of the inputs of the comparator and the comparator reacts to signals and sends back a feedback signal to the resonant tank. The resonant tank selects the correct frequency from that signal and starts a circulating current. On starting, the starting capacitor $C_2$ is connected to the non-inverting input and to the power supply. Therefore on power start-up, current goes through the starting capacitor $C_2$ which causes a voltage drop across the resonant tank circuit ($C_1$, $L_1$) and the voltage drop creates a start-up pulse. A drawback of this type of circuit is that if power is applied slowly, the level of current may not be sufficient to begin oscillation. This drawback can be detrimental in certain environments, such as inductive sensing, where it is not known whether power will be applied to the system gradually or quickly. It is, therefore, considered desirable to have an oscillator which can start oscillations irrespective of whether a gradual or quick application of power is made to the oscillator.

Thus, the present invention is directed to an inductive proximity sensor oscillator which will reach a desired start-up in a fast, efficient manner irrespective of whether power applied to the system is gradually or quickly applied. The desired operation of the oscillator being accomplished by the use of a negative feedback start-up network.

Therefore an object of the present invention is to provide a non-linear oscillator circuit which includes a start-up mechanism formed in a simple and reliable manner.

SUMMARY OF THE INVENTION

An inductive proximity sensor oscillator with a reference voltage source including a first resistance, a second resistance, a first capacitance and a reference voltage. The first resistance is connected to a positive side of the reference voltage, and to a first connection point. The first connection point is also connected to the first resistance and the first capacitance. The second resistance and the first capacitance are further connected to ground, whereby the second resistance and the first capacitance are configured in parallel to each other. A comparator is provided having inverting and non-inverting inputs. The resonant tank circuit includes a resonant inductor and a resonant capacitance connected in parallel, where one end of the resonant tank is connected to the first connection point. A current limiting resistance is connected to the output of the comparator and to the resonant tank and the non-inverting input of the comparator. A start-up circuit includes a start-up capacitance and a start-up resistance. The start-up resistance is connected to the output of the comparator and a second connection point. Further connected to the second connection point is the inverting input of the comparator and the start-up capacitance. The start-up capacitance is further connected to ground. The start-up of the inductive proximity sensor oscillator is through the negative feedback circuit comprised of the capacitor connected between the inverting input of the comparator and the circuit ground and a resistor connected between the non-inverting input and output of the comparator.

A principal advantage of the invention is the provision of a oscillator with a start-up mechanism which is independent of the manner in which voltage is applied to a circuit.

Another advantage of the invention resides in providing a start-up circuit as part of a negative feedback network which results in a fast, reliable, simple start-up mechanism.

Still other advantages and benefits of the invention will become apparent to those skilled in the art upon a reading and understanding of the following detailed description.

BRIEF DESCRIPTION OF THE DRAWINGS

The invention may take physical form in certain parts and arrangements of parts, a preferred embodiment of which will be described in detail in this specification and illustrated in the accompanying drawings which form a part hereof, and wherein.

DETAILED DESCRIPTION OF THE PREFERRED EMBODIMENT

Figure 1:
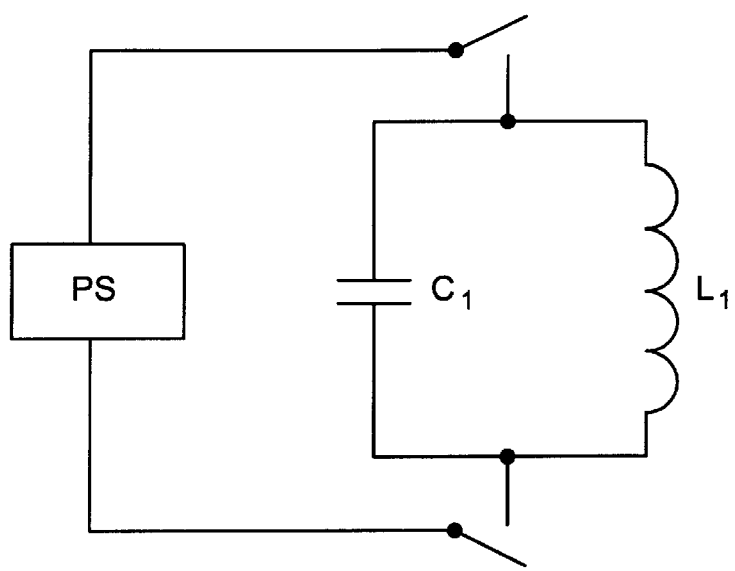
FIG. 1 is a schematic of an LC resonant circuit.
Figure 3:
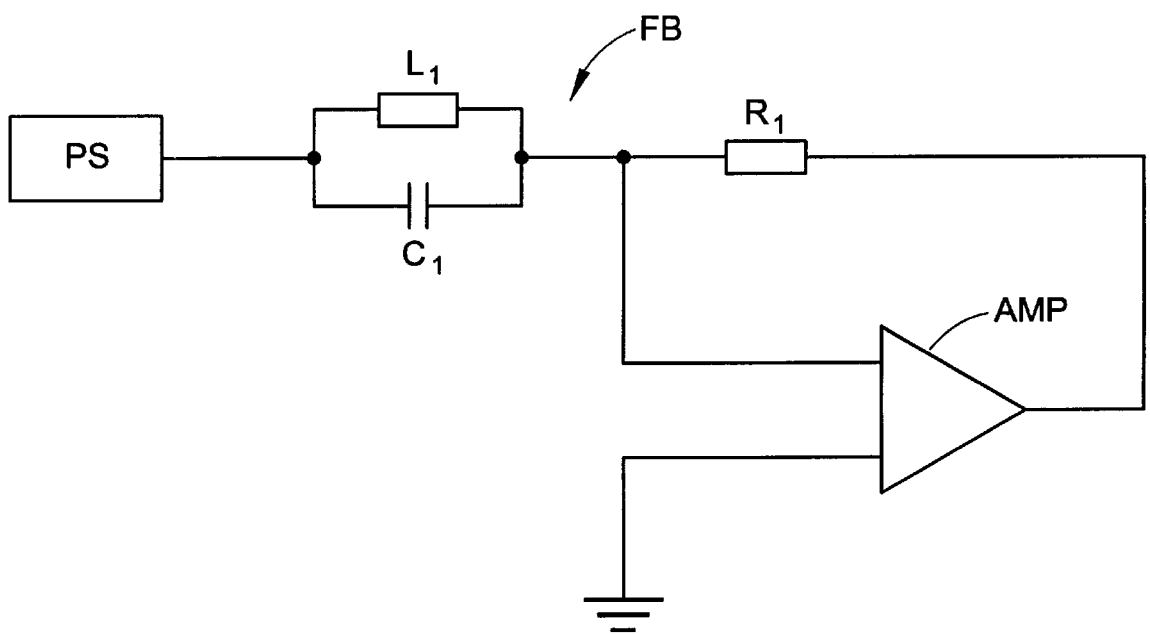
FIG. 3 is an LC circuit with an amplifier and feedback circuit.
Figure 2:
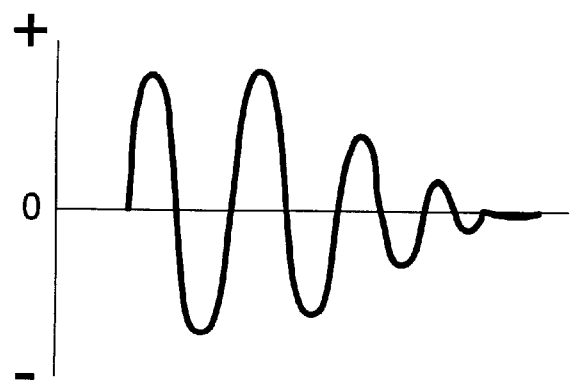
FIG. 2 is an output signal generated from the LC circuit of FIG. 1.
Figure 4:
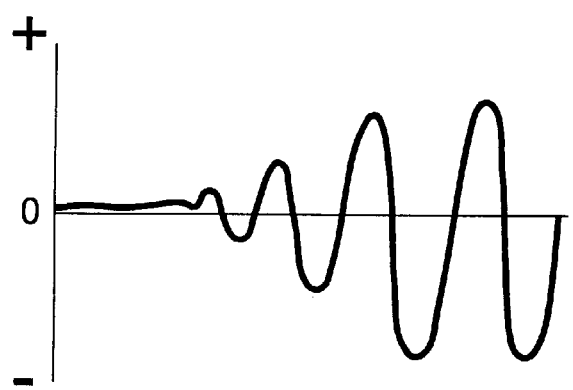
FIG. 4 is an output signal increasing in value due to the use of the amplified feedback signal.
Figure 5:
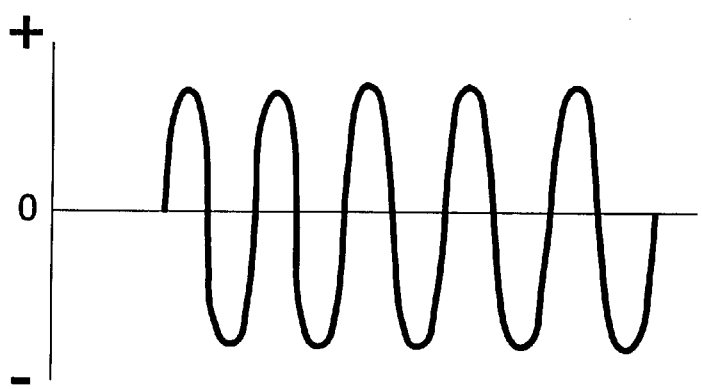
FIG. 5 is an output signal of a steady-state oscillation obtained by the use of the amplifier of FIG. 3.
Figure 6:
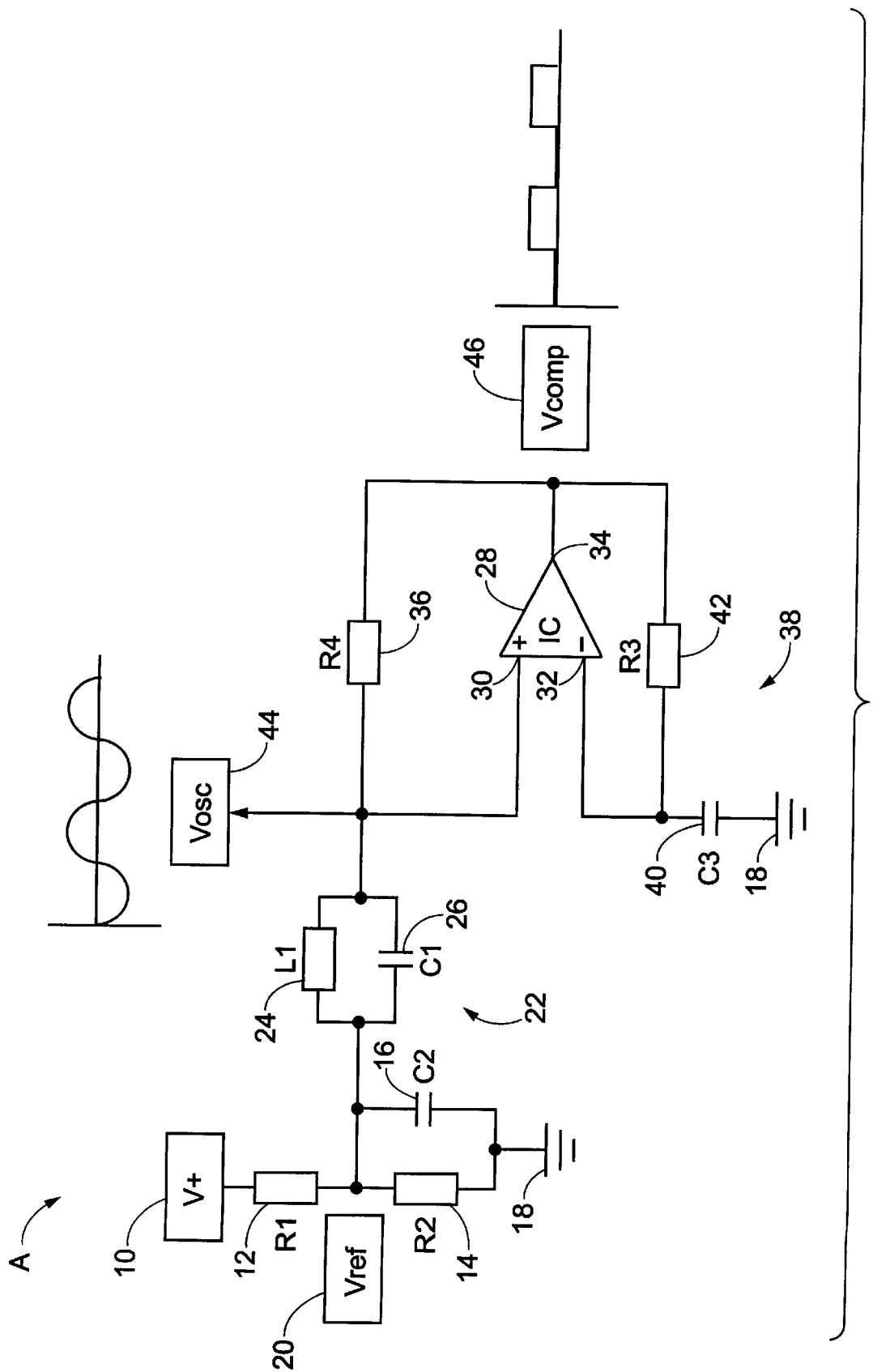
FIG. 6 is an inductive proximity sensor oscillator circuit according to the teachings of the present invention.

Reference is now made to the drawings wherein the showings are for the purposes of illustrating the preferred embodiment of the invention only and not for the purposes of limiting the invention. FIGS. 1–5 depict various concepts of oscillation circuits. FIG. 6 depicts an oscillator circuit according to the teachings of the present invention. More specifically, inductive proximity sensor oscillator A is provided with a reference voltage from a power supply 10 through a voltage divider network comprised of series connected resistors 12 and 14, and capacitor 16 in parallel with resistor 14. The voltage divider network generates a reference voltage 20 which is supplied to a resonant tank 22, comprised of an inductor 24 and capacitor 26 configured in a parallel relationship.

An integrated circuit differential comparator 28 has a non-inverting input 30, an inverting input 32, and an output terminal 34. Resonant tank 22 is connected to non-inverting input 30 of comparator 28 and current limiting resistor 36. Another end of current limiting resistor 36 is connected to the output terminal 34. The combination of current limiting resistor 36 and resonant tank 22 form a positive feedback loop of comparator 28. A negative feedback loop (or start-up network) 38 includes startup capacitor 40 connected at one end to ground, and at another end to inverting input 32 and resistor 42. Resistor 42 is also connected between inverting input 32 and output terminal 34, which is also connected to the positive feedback loop. An oscillation signal 44 is taken directly from resonant tank 22.

LC resonant tank 22 determines the oscillation frequency of circuit A according to the following equation:

$$f = 1/[2\pi\sqrt{(LC)}] \quad (1)$$

The impedance of resonant tank 22 at resonant frequency is found from the equation:

$$Z_{11} = L/(C\,R_E) \quad (2)$$

In the above equations L is the inductance of the inductor 24, C is the capacitance of the capacitor 26 and $R_E$ is the equivalent series resistance of inductor 24. The level of the oscillation signal 44 depends on the impedance of the resonant tank 22 and current limiting resistor 36.

In parallel resonant tank 22, the impedance will be at a maximum when the system is at resonant frequency. For this type of oscillator, the initial excitation energy is applied to resonant tank 22. When the supply voltage 10 is first applied to oscillator circuit A, the impedance of resonant tank 22 is low and reference voltage 20 is directly applied to non-inverting input 30 of comparator 28. The presence of negative feedback loop (start-up network) 38 allows for the necessary conditions for oscillation. Circuit A starts oscillating as a RC relaxation oscillator at a frequency determined by resistor 42 and capacitor 40, input hysteresis and the propagation delay of comparator 28.

In operation, the frequency of oscillation may be adjusted equal or up to approximately 20% higher than the resonant frequency of resonant tank 22. The signal from output terminal 34 of comparator 28 feeds resonant tank 22 through current limiting resistor 36, which causes an increase in the impedance of resonant tank 22, and as a result, the level of oscillation signal 44.

Its noted comparator output signal 46 is a square wave. This illustrates that comparator 28 has two states. It is in a high state (one) when the non-inverting input 30 is at a voltage which is greater than the voltage at the inverting input 32, and it will be in a low state (zero) when the inverting input 32 is at a voltage greater than a voltage at the non-inverting input 30. By using a comparator, operation of the circuit shown in FIG. 6 will be maintained in a stable state. In order to activate the oscillations, it is necessary to provide energy to move the system to a start state. The circuit of FIG. 6 provides negative feedback loop (start-up network) 38 which allows the start-up process to be independent of how the voltage is applied to the circuit The positive feedback loop, consisting of frequency-dependent resistance (i.e. resonant tank 22) and fixed resistance (i.e. resistor 36), allows for changing the level of positive feedback by altering the value of resistor 36. By decreasing the value of resistor 36, the ratio between resistor 36 and resonant tank 22 is altered. For example, if the value of resistor 36 is lowered, the amplitude of the feedback signal is increased. However, if the resistance is increased, the amplitude will go down. Therefore, the positive feedback is a combination of current limiting resistor 36 and resonant tank 22. The resonant tank 22 determines the oscillation frequency, and the current limiting resistor 36 is responsible for the oscillation amplitude.

Assuming that no power has been supplied to inductive proximity sensor oscillator A, no oscillations will exist. Once power is supplied, the impedance of resonant tank 22 is low, meaning reference voltage 20 is directly applied to non-inverting input 30. From an ac perspective, the resonant tank 22 is seen substantially as a wire, due to capacitor 16. From a dc perspective, when the capacitor 26 has a high impedance, the reference voltage is found between the divider resistors 12 and 14.

Thus, when initially powering oscillator A with a low impedance, reference voltage 20 is directly applied to non-inverting input 30. Voltage on non-inverting input 30 will be one-half the supply voltage 10 when resistors 12 and 14 are equal. At this stage oscillator circuit A is equivalent to an RC relaxation oscillator and point 50, will have one-half supply voltage 10, with capacitor 26 fully discharged. This changes the state of comparator 28 to a high state, or will support an existing high state.

With comparator 28 in a high state, a charge is being generated on the capacitor 26, because output voltage 46 of comparator 28 is a rail-to-rail output (i.e. the maximum output voltage of the system). This condition means the output voltage 46 is a positive rail voltage and that this voltage is only one-half the input voltage 10. In this condition, output voltage 46 also begins charging capacitor 40 until it reaches and then slightly exceeds the voltage level at point 30. The voltage on capacitor 40 will in fact actually pass the voltage level at point 30 due to internal hysteresis. At the point where the voltage on non-inverting input 30 is less than the voltage on inverting input 32, the comparator switches to a low state, and capacitor 40 begins to discharge. Discharging of capacitor 40 causes the voltage level on inverting input 32 to go back below the voltage level on non-inverting input 30. This action causes generation of oscillations, such as a RC relaxation oscillator, to develop at a frequency which is determined in accordance with an RC oscillator. The oscillations will have a propagation delay due to delays within comparator 28.

Oscillation circuit A is designed such that the initial frequency or start-up frequency is adjusted to a frequency close to the resonance of resonant tank 22, or up to 20% above that value. Thus, when power is first applied impedance is substantially zero, but the circuit starts oscillating at a frequency close to the resonant frequency due to negative feedback network (start-up circuit) 38. These oscillations are provided to resonant tank 22, and since resonant tank 22, at a frequency close to resonance, has a relatively high impedance, it means the impedance will go from zero to a very high value in a short time.

Also, the level at point 30 moves up because the power being supplied to point 30 while originally only reference voltage 20, is now reference voltage 20 plus a signal from the negative feedback network.

In particular, by applying reference voltage 20 to point 30, comparator 28 is made to enter into a high state. This causes an output from output terminal 34, which supplies voltage to both the positive feedback network and the negative feedback network. The voltage applied to the negative feedback network charges capacitor 40 to a level, higher than the voltage at point 30. The voltage of capacitor 40 is at inverting input 32 which causes comparator 28 to switch to a low state. At this stage, capacitor 40 discharges through resistor 42 and this energy is absorbed into the positive feedback network (i.e. resistor 36 and resonant tank 22). Therefore, resonant tank 22 is not receiving only a reference voltage 20 but also additional voltage levels from the negative feedback loop 38.

When the voltage at point 32 is below the voltage at point 30, comparator 28 again switches to a high state. This switching of comparator 28 from high to low states builds the voltage level for the positive feedback network.

The change in the voltage level at point 32, i.e. the voltage ripple, is very low. However, the change point 34, when the feedback signal to resonant tank 22 is close to resonant frequency, is much greater. This means the alternating signal or oscillation signal at point 34 is much greater than the signal change at point 32 since a much smaller ripple at point 32 is needed in order to accomplish the desired switching. As the oscillation continues, the positive feedback network becomes dominant so the negative feedback network is only used for the startup in order to produce the desired output frequency levels.

As the system charges up, the functions are switched. Particularly, at the beginning a one-half voltage supply 10 (i.e. reference voltage 20) is provided at point 30, which causes comparator 28 to go high, and in turn starts charging capacitor 40 to a level slightly above the reference voltage value 20. Capacitor 40 charges/discharges slightly above and slightly below this level. This slight ripple is maintained due to the 50% duty cycle output from rail-to-rail of the power supply. When the oscillation signals 44 become much greater, the potential at point 52 maintains the same amount of ripple change, but compared with the much larger change now existing at point 54, it is negligible and can be ignored. Thus, inverting input 32 of comparator 28 is utilized to provide the negative feedback during start-up time and when the oscillations have built up to a desired value, the positive feedback dominates and continues like a normal positive feedback regeneration circuit.

The present invention provides a quick start to oscillation since the system is applying rail-to-rail voltage rather than a micro-volt increase to the resonant tank circuit. In particular, this system is applying a full power to the resonant tank which creates very powerful starting pulses which go up at a fast rate.

Therefore, provided is a simple circuit with a substantial amount of intelligent dynamics. This self-starting mechanism is part of the applying of power to the system, so it is not an external circuit feature. Rather the start-up mechanism is part of the overall system operation and is maintained as part of the signal used for continuous operation. Thus, the present invention is not simply an improvement of the start-up mechanism but actually provides a different conceptual approach to starting up the oscillator circuit.

Figure 7:
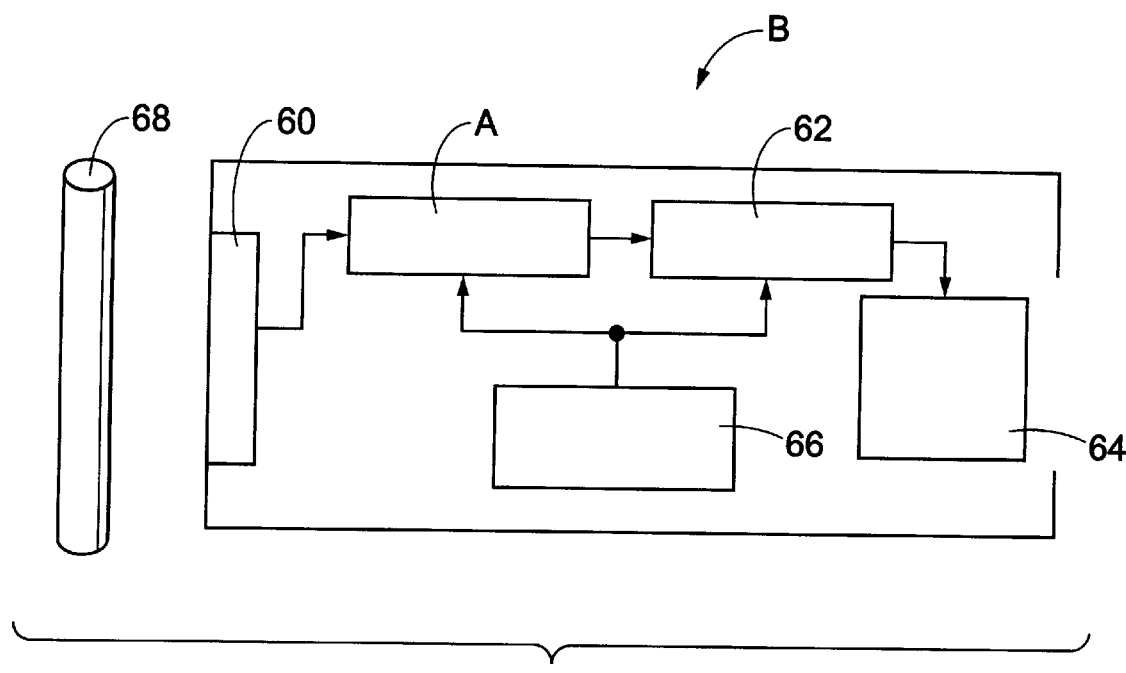
FIG. 7 is an inductive proximity sensor incorporating the oscillator of FIG. 6.

Turning to FIG. 7, illustrated is an inductive proximity sensor B implementing the inductive proximity sensor oscillator A of the present invention. Shown is an external inductive sensor 60 and a detector 62, output 64 and regulator 66 all used in a conventional manner. When an object 68, of appropriate material, is passed within a predetermined range of sensor 60, the balance of oscillator circuit A is disrupted such that oscillations begin and thereby normal sensing of an inductive proximity sensor B is undertaken.

The invention has been described with reference to the preferred embodiment. Obviously, modifications and alterations will occur to others upon a reading and understanding of this specification. It is intended to include all such modifications and alterations insofar as they come within the scope of the appended claims or the equivalents thereof.

Having thus described the invention, it is now claimed:

1. An inductive proximity sensor oscillator comprising:
   a reference voltage source including, a first resistance, a second resistance, a first capacitance, and a voltage source, the first resistance connected to a positive side of the voltage source, and to a first connection point, the first connection point also having connected thereto the second resistance and the first capacitance, the second resistance and the first capacitance further connected to ground, whereby the second resistance and the first capacitance are connected in parallel;
   a comparator including an inverting input, a non-inverting input and an output;
   a resonant tank circuit including a resonant inductance and a resonant capacitance connected in parallel, one end of the resonant tank connected to the first connection point;
   a current limiting resistance connected to the output of the comparator, and to the resonant tank and the non-inverting input of the comparator; and
   a start-up circuit including, a start-up capacitance and a start-up resistance, the start-up resistance connected the output of the comparator, and to a second connection point, to which is also connected the inverting input of the comparator and the start-up capacitance, the start-up capacitance further connected to the ground.

2. The inductive proximity sensor oscillator according to claim 1 wherein the resonant tank and the current limiting resistance form a positive feedback loop of the comparator.

3. The inductive proximity sensor oscillator according to claim 2 wherein the resonant tank determines oscillation frequency of the circuit.

4. The inductive proximity sensor oscillator according to claim 3 wherein the oscillation frequency is determined by, $$f = 1/[2\pi\sqrt{(LC)}]$$

wherein L is inductance of the resonant tank and C is capacitance of the resonant tank.

5. The inductive proximity sensor oscillator according to claim 3 wherein an impedance of the resonant tank is found by, $$Z = L/(C*R_E),$$

wherein L is inductance of the resonant tank, C is capacitance of the resonant tank, and $R_E$ is the equivalent series resistance of the resonant tank.

6. The inductive proximity sensor oscillator according to claim 4 wherein a level of an oscillation signal depends on the impedance of the resonant tank and the current limiting resistance.

7. The inductive proximity sensor oscillator according to claim 1 wherein the comparator is a differential amplifier.

8. The inductive proximity sensor oscillator according to claim 1 wherein the start-up circuit is part of a negative feedback loop of the comparator.

9. The inductive proximity sensor oscillator according to claim 8 wherein the negative feedback loop includes a capacitor connected between an inverting input of the comparator and circuit ground, and a resistor connected between the non-inverting input and output of the comparator.

10. The inductive proximity sensor oscillator according to claim 2 wherein the positive feedback loop determines the frequency and amplitude of oscillation.

11. An inductive proximity sensor oscillator comprising:
    a differential comparator having an inverting input, a non-inverting input and an output;
    a positive feedback network connected to the differential comparator, wherein the positive feedback network determines a frequency and amplitude of oscillations generated by the oscillator and;
    a negative feedback network connected to the differential comparator, wherein the negative feedback network is a start-up network which allows the oscillator to generate oscillation signals irrespective of a manner in which a voltage is applied to the circuit, wherein the differential comparator, positive feedback circuit and negative feedback circuit allow for continuous operation of the oscillator.

12. The inductive proximity sensor according to claim 11, wherein the positive feedback network includes (i) an LC resonant tank circuit connected between the non-inverting input and a fixed potential terminal, and (ii) a current limiting resistor connected between the non-inverting input and the output of the differential comparator.

13. The inductive proximity sensor according to claim 11 wherein the negative feedback network includes (i) a capacitor connected between the inverting input and circuit ground, and (ii) a resistor connected between the non-inverting input and output of the differential comparator.

14. An inductive proximity sensor oscillator comprising:
    a differential comparator having an inverting input, a non-inverting input and an output;
    a positive feedback network connected to the comparator, wherein the positive feedback network determines the frequency and amplitude of generated oscillations and;
    a negative feedback network connected to the differential comparator, wherein the negative feedback network is a start-up network which allows the oscillator to generate oscillation signals irrespective of a manner in which a voltage is applied to the circuit and said negative feedback network is dominant only during startup and periods of low impedance in said positive feedback network.

* * * * *